(12) United States Patent
Harada et al.

(10) Patent No.: US 10,971,325 B2
(45) Date of Patent: Apr. 6, 2021

(54) DEFECT OBSERVATION SYSTEM AND DEFECT OBSERVATION METHOD FOR SEMICONDUCTOR WAFER

(71) Applicant: HITACHI HIGH-TECH CORPORATION, Tokyo (JP)

(72) Inventors: Minoru Harada, Tokyo (JP); Yuji Takagi, Tokyo (JP); Naoaki Kondo, Tokyo (JP); Takehiro Hirai, Tokyo (JP); Yohei Minekawa, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 0 days.

(21) Appl. No.: 16/567,687

(22) Filed: Sep. 11, 2019

(65) Prior Publication Data

US 2020/0083017 A1 Mar. 12, 2020

(30) Foreign Application Priority Data

Sep. 12, 2018 (JP) .............................. JP2018-170923

(51) Int. Cl.
*H01J 37/147* (2006.01)
*G01N 21/956* (2006.01)
(Continued)

(52) U.S. Cl.
CPC ........ *H01J 37/147* (2013.01); *G01N 21/9503* (2013.01); *G01N 21/956* (2013.01);
(Continued)

(58) Field of Classification Search
CPC ........... G06T 2207/30148; G06T 7/001; G06T 2207/10061; G06T 5/50; G06T 7/0004;
(Continued)

(56) References Cited

U.S. PATENT DOCUMENTS 6,166,380 A * 12/2000 Kitagawa ................ H01J 37/28
250/307
7,919,760 B2 * 4/2011 Jau ..................... H01L 21/67288
250/442.11

(Continued)

FOREIGN PATENT DOCUMENTS

JP 2001189358 A 7/2001
JP 2006269489 A 10/2006
(Continued)

*Primary Examiner* — David A Vanore
(74) *Attorney, Agent, or Firm* — Miles & Stockbridge, P.C.

(57) ABSTRACT

In a device for observing a semiconductor wafer, a positional relationship between an in-wafer region and a background region in an imaging field of view is not constant when an outer peripheral portion of the wafer is imaged, which results in an increase in the quantity of calculation in defect detection and image classification processing and makes it difficult to efficiently perform defect observation and analysis. There is provided a defect observation system for a semiconductor wafer, and the system includes: a stage on which the semiconductor wafer is placed and which is movable in an XY direction, an imaging unit that is configured to image a portion including an edge of the semiconductor wafer, and an image output unit that is configured to, with respect to a plurality of images obtained by imaging, output images in which edges of the wafer are substantially in parallel among the plurality of images.

16 Claims, 10 Drawing Sheets

(51) Int. Cl.
*G06T 7/00* (2017.01)
*G01N 21/95* (2006.01)
*G06T 5/50* (2006.01)
*H01L 21/67* (2006.01)
*H01J 37/28* (2006.01)
*G06T 7/12* (2017.01)

(52) U.S. Cl.
CPC ............ *G06T 5/50* (2013.01); *G06T 7/0004* (2013.01); *G06T 7/12* (2017.01); *H01J 37/28* (2013.01); *H01L 21/67288* (2013.01); *G06T 2207/10061* (2013.01); *G06T 2207/30148* (2013.01); *H01J 2237/30483* (2013.01)

(58) Field of Classification Search
CPC . G06T 2207/20081; G06T 2207/20084; G06T 2207/20212; G06T 7/12; G06T 7/13; G06T 7/32; G06T 7/33; G06T 7/55; G06T 7/73; G06T 7/74; H01J 37/28; H01J 37/2817; H01J 37/244; H01J 2237/202; H01J 2237/221; H01J 2237/24465; H01J 2237/24495; H01J 2237/24578; H01J 2237/24585; H01J 2237/28; H01J 2237/30483; H01J 37/147; H01J 37/20; H01J 37/22; H01J 37/226; H01J 37/265; G01N 21/956; G01N 21/9501; G01N 23/2251; G01N 2021/1765; G01N 2021/8848; G01N 2021/8861; G01N 2021/8867; G01N 2021/95615; G01N 21/47; G01N 21/8851; G01N 21/9503; G01N 21/95607; G01N 21/95623; G01N 2201/06113; G01N 2201/0636; G01N 2223/30; G01N 2223/646; G01N 23/22; G01N 23/2204

USPC ..... 250/307, 310, 396 R, 442.11; 356/237.2, 356/237.5

See application file for complete search history.

(56) References Cited

U.S. PATENT DOCUMENTS

| | | | |
|---|---|---|---|
| 10,562,130 B1* | 2/2020 | Donofrio | H01L 21/02686 |
| 2006/0115142 A1* | 6/2006 | Sim | G06T 7/001 |
| | | | 382/145 |
| 2010/0327160 A1* | 12/2010 | Zhao | H01J 37/28 |
| | | | 250/307 |
| 2013/0120551 A1* | 5/2013 | Yamada | H04N 7/18 |
| | | | 348/80 |
| 2016/0011123 A1* | 1/2016 | Shibata | H04N 5/2256 |
| | | | 356/237.5 |
| 2016/0163035 A1* | 6/2016 | Chang | G06T 7/0004 |
| | | | 382/149 |
| 2016/0211112 A1* | 7/2016 | Nakao | H01J 37/226 |
| 2017/0082425 A1* | 3/2017 | Minekawa | G01B 11/30 |
| 2017/0328842 A1* | 11/2017 | Otani | G01N 21/95623 |
| 2018/0019097 A1* | 1/2018 | Harada | H01J 37/244 |
| 2019/0019728 A1* | 1/2019 | Fitzgerald | H01L 21/78 |
| 2020/0083017 A1* | 3/2020 | Harada | G01N 21/956 |

FOREIGN PATENT DOCUMENTS

| | | |
|---|---|---|
| JP | 2007040910 A | 2/2007 |
| JP | 2012186177 A | 9/2012 |
| JP | 2013070083 A | 4/2013 |

\* cited by examiner

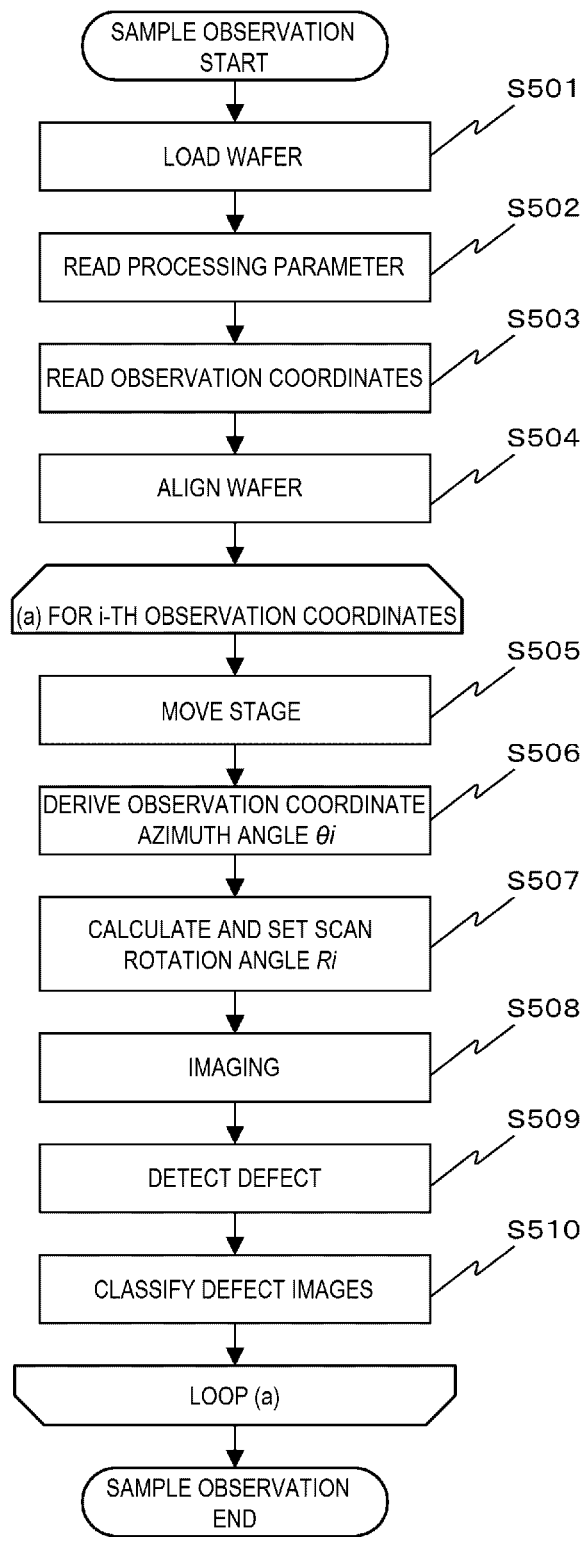

DEFECT OBSERVATION SYSTEM AND DEFECT OBSERVATION METHOD FOR SEMICONDUCTOR WAFER

BACKGROUND OF THE INVENTION

1. Field of the Invention

The present invention relates to a defect observation system and a defect observation method for a semiconductor wafer.

2. Description of the Related Art

In manufacturing of a semiconductor wafer, in order to secure profits, it is important to establish a manufacturing process quickly and to transition to a high yield mass production system promptly. For this purpose, various inspection devices, observation devices, and measurement devices are introduced into the manufacturing line.

The inspection device outputs a defect position coordinate which is coordinate information indicating a defect position on a sample. Based on the defect position coordinate, the defect observation device images the defect position on the sample (wafer) at a high resolution, and outputs an image. As the defect observation device, an observation device (hereinafter, referred to as a review SEM) that uses a Scanning Electron Microscope (SEM) has been widely used. In a mass production line of a semiconductor, automation of observation work is desired. When a review SEM is used, it is possible to perform Automatic Defect Review (ADR) processing for automatically collecting defect images of defect positions in a sample, and Automatic Defect Classification (ADC) processing for automatically classifying the collected defect images.

Since the defect position coordinates output by the inspection device contain an error, ADR is provided with a function of re-detecting a defect from an image, which is imaged in a wide field of view with the defect position coordinate output by the inspection device as a center, and imaging the re-detected defect position at a high magnification to obtain an observation image. As a method of defecting a defect from an SEM image, a method has been developed (for example, see JP-A-2001-189358 (Patent Literature 1)) in which an image obtained by imaging a region, where a circuit pattern identical to that in a defect portion is formed, is set as a reference image, and an image obtained by imaging the defect portion is compared with the reference image to detect a defect. Further, a method of detecting a defect from one image obtained by imaging a defect portion has been developed (see, for example, JP-A-2007-40910 (Patent Literature 2)).

In semiconductor manufacturing, it is important in process management to grasp a state of an outer peripheral portion (also referred to as a bevel portion) of a wafer. As a device that inspects a defect on the outer peripheral portion, a device including a charged particle microscope and a rotary stage (θ stage) is disclosed (for example, see U.S. Pat. No. 7,919,760 (Patent Literature 3)). As a device for observing and analyzing a defect portion based on output of another inspection device, a device including a charged particle microscope and a rotary stage is disclosed (for example, see JP-A-2013-70083 (Patent Literature 4)). In this device, a scanning direction of a charged particle beam during image capturing can be dynamically changed according to a rotation angle of the rotary stage.

There are many types of structures of circuit patterns formed on the semiconductor wafer, and the types and locations of defects that occur are also varied. In order to enhance the visibility of the circuit patterns of various structures and the visibility of various types of defects, electrons that have different emission angles and emission energy when emitted from a sample are detected using a plurality of detectors, which is effective. For example, it is disclosed that electrons generated from a sample are detected with emission elevation angles and azimuth angles being discriminated, so that target unevenness information can be grasped (for example, see JP-A-2012-186177 (Patent Literature 5)).

As a method of classifying defect images, there is disclosed a method including recognizing a wiring region from an image, quantifying the criticality of a defect, and recognizing an unevenness state of the defect (for example, see JP-A-2006-269489 (Patent Literature 6)).

SUMMARY OF THE INVENTION

In a defect observation device that includes a translation stage, when an outer peripheral portion of a wafer is imaged, a positional relationship between an in-wafer region and an outside-wafer region in the captured image differs according to the imaging position since the wafer is circular. For example, when the right side of the wafer is imaged, the outside-wafer region appears on the right side of the captured image, whereas when the left side of the wafer is imaged, the outside-wafer region appears on the left side of the captured image. In this case, since correspondence cannot be achieved with only the alignment in a translation direction, a large quantity of calculation is required in defect detection processing, classification processing, and the like. The above problem not only causes a decrease in detection speed, but also causes a decrease in defect detection rate due to processing complexity.

One aspect of the invention provides a defect observation system for a semiconductor wafer, and the system includes: a stage on which the semiconductor wafer is placed and which is movable in an XY direction, an imaging unit that is configured to image a portion including an edge of the semiconductor wafer, and an image output unit that is configured to, with respect to a plurality of images obtained by imaging, output images in which edges of the semiconductor wafer are substantially in parallel among the plurality of images.

Another aspect of the invention provides a defect observation method for a semiconductor wafer, and the method includes: an imaging step of imaging a plurality of portions including an edge of a wafer while moving the semiconductor wafer in an XY direction on a plane, an output step of, with respect to a plurality of images obtained by imaging, outputting images in which edges of the semiconductor wafer are substantially in parallel among the plurality of images; and a defect detection step of detecting a defect of the semiconductor wafer in the output images.

Still another aspect of the invention provides a program that causes a computer to execute the defect observation method described above. A storage medium in which the program is stored readably by a computer also falls within the technical scope of the invention.

Problems, configurations, and effects other than those described above will be apparent with reference to the description of following embodiments.

According to the invention, even when an observation device including a translation stage is used to image an outer peripheral portion of a wafer, a positional relationship between an in-wafer region and a background region can be kept constant in the field of view of the image. Accordingly, it is unnecessary or easy to separate the in-wafer region and the background region in the defect detection processing, the classification processing, and the like, and the processing speed, the defect detection rate, and the classification accuracy rate are easily improved.

BRIEF DESCRIPTION OF THE DRAWINGS

FIG. 5 is a flowchart illustrating a main flow of a sample observation process according to an embodiment of the invention.

DESCRIPTION OF THE PREFERRED EMBODIMENTS

Figure 1:
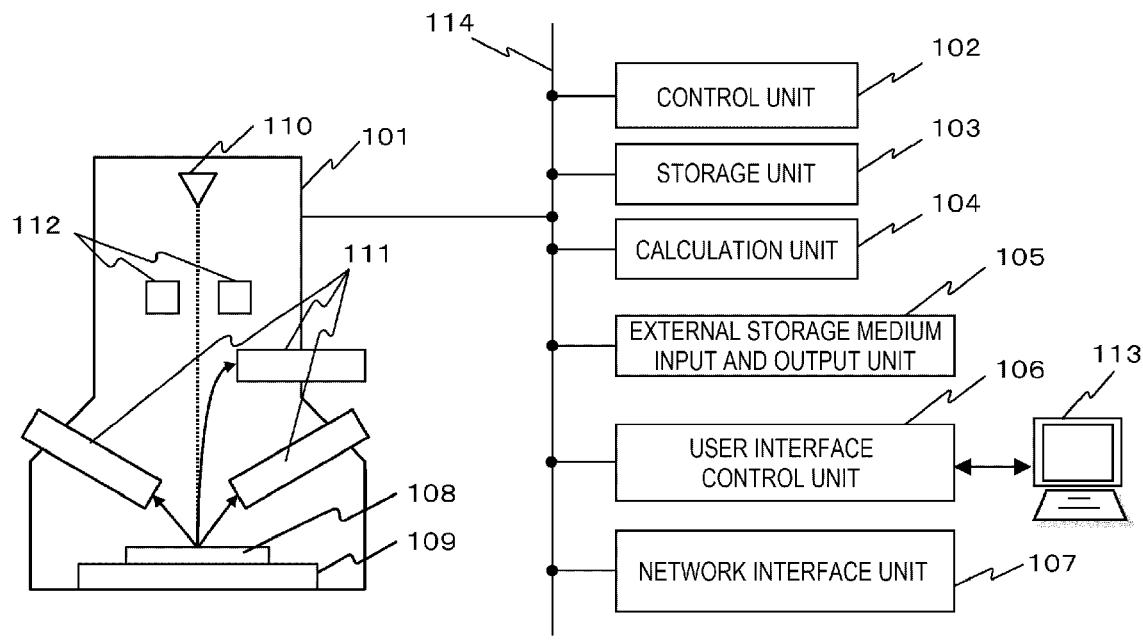
FIG. 1 is a diagram schematically illustrating a defect observation system for a semiconductor wafer according to an embodiment of the invention.

Hereinafter, embodiments of the invention will be described with reference to the drawings. The objects, features, advantages, and ideas of the invention will be apparent to those skilled in the art from the description herein, and for clarity of illustration, the description may be omitted or simplified as appropriate, but those skilled in the art can still easily reproduce the invention from the description of this specification. The embodiments of the invention described below are preferred embodiments of the invention, are presented for purposes of illustration or description, and are not intended to limit the invention thereto. Therefore, the invention may be embodied in various other forms. It will be apparent to those skilled in the art that various changes and modifications can be made based on the description herein within the spirit and scope of the invention disclosed herein.

In the following description, processes to be performed by executing a program may be described, but since the program is executed by a processor (for example, a CPU or a GPU) by using a storage resource (for example, a memory) and/or an interface device (for example, a communication port) as appropriate, the subject of the processing may be a processor. Similarly, the subject of the processing to be performed by executing the program may be a controller, a device, a system, a computer, or a node that is provided with a processor. The subject of the processing to be performed by executing the program may be a calculation unit, and may include a dedicated circuit (for example, an FPGA or an ASIC) that performs a specific process.

The program may be installed from a program source into a device such as a computer. The program source may be, for example, a program distribution server or a computer-readable storage medium. When the program source is a program distribution server, the program distribution server includes a processor and a storage resource for storing the program to be distributed, and the processor of the program distribution server may distribute the program to be distributed to another computer. In the following description, two or more programs may be implemented as one program, or one program may be implemented as two or more programs.

<Defect Observation System for Semiconductor Wafer>

First, a defect observation system for a semiconductor wafer according to an embodiment of the invention will be described.

The defect observation system according to the embodiment of the invention includes: a stage on which a semiconductor wafer is placed and which is movable in an XY direction, an imaging unit that images a portion including an edge of the semiconductor wafer, and an image output unit that, with respect to a plurality of images obtained by imaging, outputs images in which edges of the wafer are substantially in parallel among the plurality of images. A defect detection unit that detects a defect of the semiconductor wafer in the output image, and a defect image classification unit that classifies the output images may be provided.

It should be noted that an aspect in which "substantially the same" is completely the same is contained in this specification, but to be completely the same is not necessary. Comparison object may have an error of 10% or less of a length (for example, a length of an edge of an image or a length of an edge of the semiconductor wafer in the image) which is a reference, preferably an error of 5% or less, more preferably an error of 1% or less, further preferably an error of 0.5% or less, and still more preferably an error of 0.1% or less.

Similarly, an aspect in which "substantially parallel" is completely parallel is contained in this specification, but to be completely parallel is not necessary. A maximum angle formed with each other may include an error of 10° or less, preferably an error of 5° or less, more preferably an error of 1° or less, further preferably an error of 0.5° or less, and still more preferably an error of 0.1° or less.

FIG. 1 shows a configuration of the defect observation system according to the embodiment of the invention. The defect observation system includes: an observation device 101 that images a wafer, a control unit 102 that performs overall control, a storage unit 103 that stores information in an magnetic disk, a semiconductor memory or the like, a calculation unit 104 that performs calculating according to a program, an external storage medium input and output unit 105 that inputs and outputs information from and to an external storage medium connected to the device, a user interface control unit 106 that controls input and output of information from and to a user, and a network interface unit 107 that communicates with a defect image classification device via a network. An input and output terminal 113 including a keyboard, a mouse, a display, and the like is connected to the user interface control unit 106. The observation device 101 may include: a movable stage 109 on which a sample wafer 108 is placed and which is capable of moving in an XY direction, an electron source 110 that irradiates the sample wafer 108 with an electron beam so as to serve as an imaging unit, a detection device 111 that detects secondary electrons or reflected electrons generated from the sample wafer, an electron lens (not shown) that converges the electron beam on the sample, and a deflector (112) that causes the electron beam to scan the sample wafer. The observation device 101 is not particularly limited, but is preferred to be a charged particle microscope, and specifically, a Scanning Electron Microscope (SEM).

Figure 2:
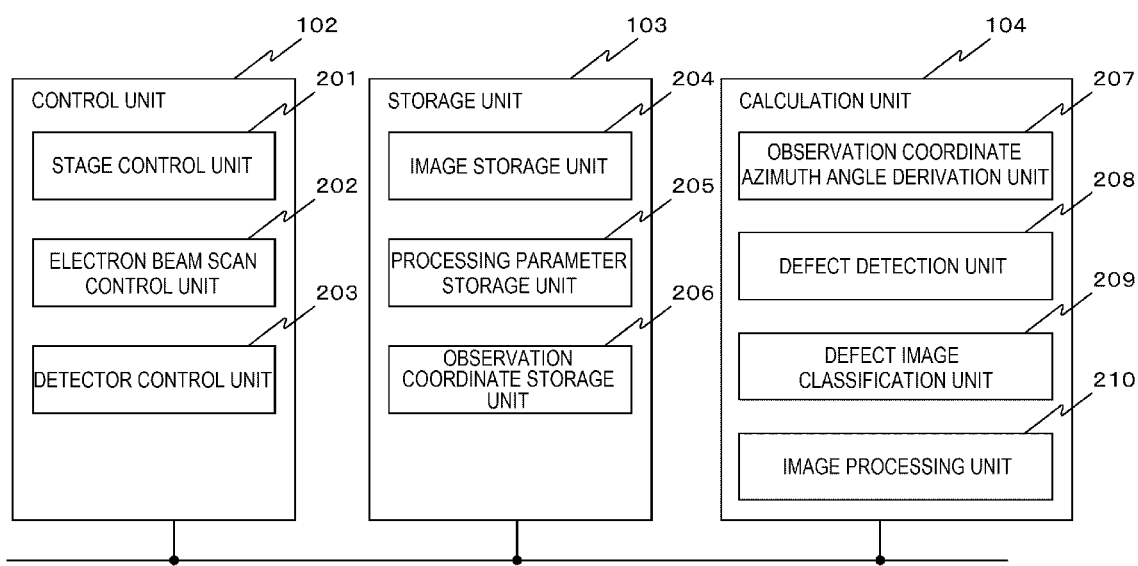
FIG. 2 is a diagram schematically illustrating configurations of a control unit, a storage unit, and a calculation unit in the defect observation system according to the embodiment of the invention.

FIG. 2 is a diagram illustrating configurations of the control unit 102, the storage unit 103, and the calculation unit 104 in the embodiment of the invention. A stage control unit 201 provided in the control unit 102 controls movement and stop of the stage. An electron beam scan control unit 202 controls the deflector 112 such that the electron beam is emitted within a predetermined field of view. A detector control unit 203 samples a signal from the detection device 111 in synchronization with the scanning of the electron beam, adjusts a gain, an offset, and the like, and generates a digital image. The storage unit 103 includes: an image storage unit 204 that stores the generated digital image together with supplementary information, a processing parameter storage unit 205 that stores imaging conditions, or defect detection processing parameters, classification processing parameters, and the like, and an observation coordinate storage unit 206 that stores input inspection coordinates of a defect to be observed. The calculation unit 104 includes: an observation coordinate azimuth angle derivation unit 207 that derives an azimuth angle of an observation coordinate viewed from a center of the wafer, a defect detection unit 208 that detects a defect portion from images, a defect image classification unit 209 that classifies the images according to defect types or a classification criterion designated by a user, and an image processing unit 210 which is provided with an image output unit that outputs images subjected to image processing in an image deformation unit that performs image preprocessing such as smoothing and contrast adjustment and deformation such as moving and rotating of the image, the image storage unit 204, the defect detection unit 208, and the user interface control unit 106.

The configuration and arrangement of the detection device, which detects secondary electrons or reflected electrons generated from the sample wafer, are not particularly limited, and the configuration and number of the electron detectors provided in the detection device are not particularly limited. An embodiment of the detection device 111 shown in FIGS. 3A to 3C will be described in detail below.

Figure 3A:
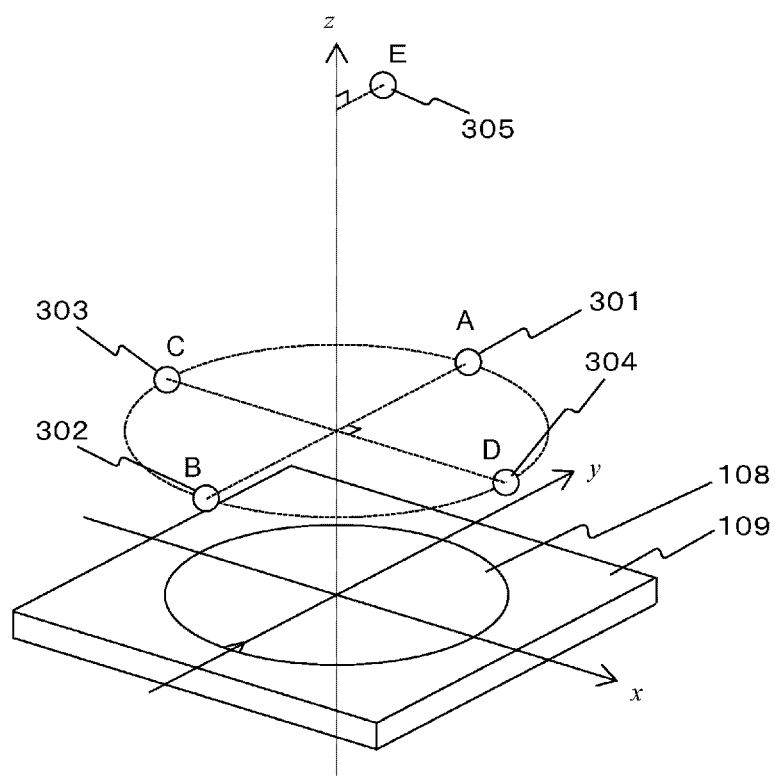
FIG. 3A is a diagram (projection) schematically illustrating a configuration of a detector according to the embodiment of the invention.
Figure 3B:
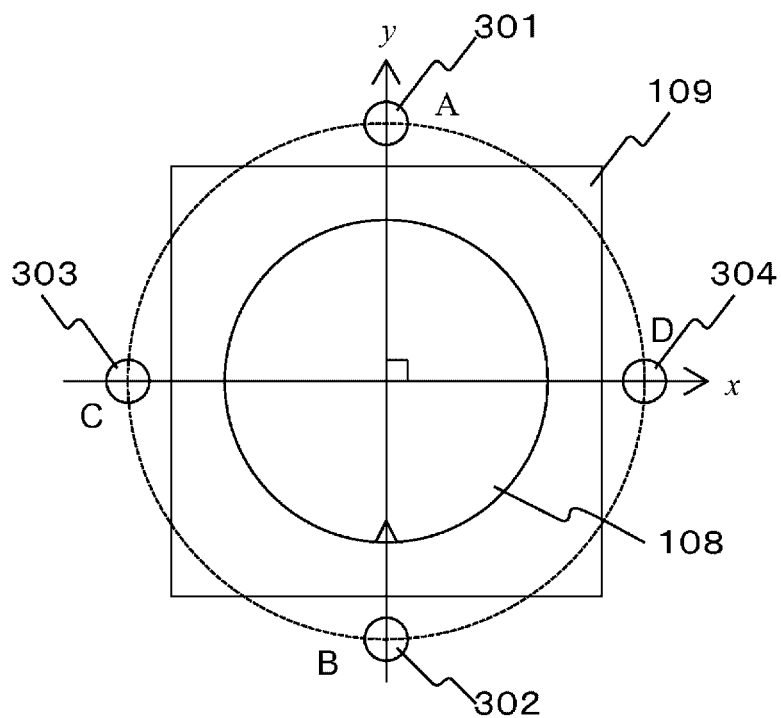
FIG. 3B is a diagram schematically illustrating a configuration of the detector (viewed from a z-axis) according to the embodiment of the invention.
Figure 3C:
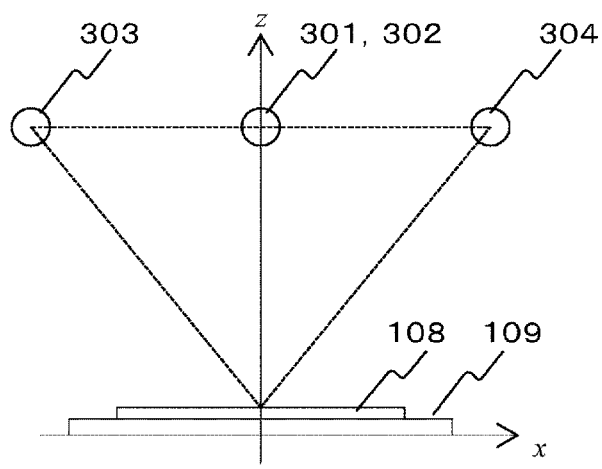
FIG. 3C is a diagram schematically illustrating a configuration of the detector (viewed from a y-axis) according to the embodiment of the invention.

FIGS. 3A to 3C are diagrams schematically illustrating positional relationships between detectors 301 to 305 and the sample 108. FIG. 3A is a projection, and FIGS. 3B and 3C are respectively viewed from a z-axis and a y-axis (the detector 305 is not shown). Here, 301 to 304 represent a plurality of detectors configured to selectively detect electrons having specific emission angles (elevation angle and azimuth angle). For example, electrons emitted in the y direction from the sample 108 are mainly detected by the detector 301. Accordingly, it is possible to acquire an image with a contrast as if light was applied from the detector direction. The detector 305 mainly detects secondary electrons emitted from the sample.

<Defect Observation Method for Semiconductor Wafer I>

An embodiment of the invention is a defect observation method for a semiconductor wafer, the method includes: an imaging step of imaging a plurality of portions including an edge of a semiconductor wafer while moving the semiconductor wafer in an XY direction on a plane, an output step of, with respect to a plurality of images obtained by imaging, outputting images in which edges of the semiconductor wafer are substantially in parallel among the plurality of images, and a defect detecting step of detecting a defect of the semiconductor wafer in the output images.

Figure 4A:
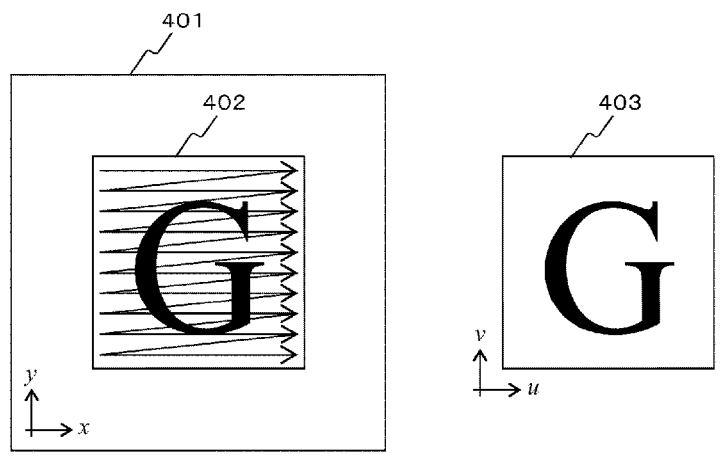
FIG. 4A is a diagram illustrating an image capturing method by scan rotation (before rotation) according to an embodiment of the invention.
Figure 4B:
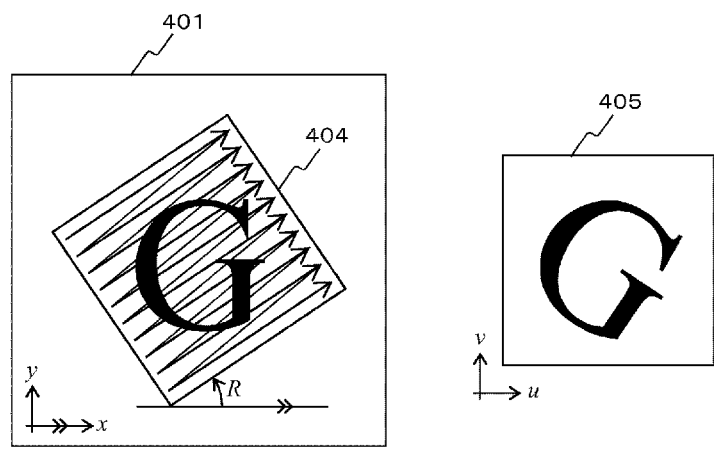
FIG. 4B is a diagram illustrating the image capturing method by scan rotation (after rotation) according to the embodiment of the invention.

First, an embodiment of an imaging principle will be described with reference to FIGS. 4A and 4B. The electron beam scan control unit 202 controls the deflector 112 such that an electron beam is emitted in a predetermined imaging field of view. Specifically, scanning is performed in a fixed direction, then shifted in a direction orthogonal to the fixed direction and scanning is performed again within the imaging field of view, which is repeated so that the entire imaging field of view is irradiated with the electron beam. At this time, the signal detected by the detection device 111 in synchronization with the scanning of the electron beam is converted into a digital signal so that an image can be obtained. FIG. 4A schematically illustrates a state in which scanning is performed with an electron beam in an imaging field of view 402 in a sample 401, and an obtained image 403. FIG. 4B is an example in which an angle is given to an imaging region in a coordinate system (x, y) of the sample 401 by controlling a scanning direction of the electron beam. Specifically, FIG. 4B illustrates a state in which a region 404 given an angle R is scanned with respect to the sample 401, and an obtained image 405. The obtained image 405 is rotated with respect to the image 403. Hereinafter, imaging at an angle is described as scan rotation, and the angle R at that time is described as a scan rotation angle. The coordinate system of the sample is described as (x, y) and the coordinate system of the image as (u, v).

Next, a specific embodiment of imaging a plurality of portions including an edge of a semiconductor wafer while moving the semiconductor wafer in an XY direction on a plane will be described with reference to FIG. 5.

Here, first, a semiconductor wafer to be observed is placed on a stage (S501), and processing parameters corresponding to the wafer to be observed are read from the storage unit 205 (S502). The semiconductor is manufactured through a number of manufacturing processes. The appearance of the semiconductor may vary greatly in each process, and characteristics thereof such as likelihood of electrification may also vary. For this reason, it is common to adjust and store imaging conditions and processing parameters for each process and device. Observation coordinates storing a coordinate list of positions at which the observation is performed are read from the storage unit 206 at the same time of or after reading the processing parameter (S503). The observation coordinates may be defect coordinates output by another defect inspection device, or coordinates input by the user as coordinates desired to be observed. Next, the wafer positions are aligned (S504). Although the wafer is placed on the stage using a robot arm or the like, a positional deviation or a rotational deviation of about several hundred microns occurs at that time. Therefore, a positional deviation amount is calculated through image processing after an edge portion or a position with a known unique pattern, of the wafer, is imaged. Accordingly, it is possible to correct the observation coordinates, and to correctly calculate center coordinates of the wafer.

Next, an embodiment of a procedure for obtaining images of a defect portion for i-th observation coordinates and classifying the images according to defect types or a classification criterion designated by a user will be described. First, the stage control unit 201 is used to move the stage such that observation coordinates of a position to be observed are in a field of view of the observation device. At this time, in order to absorb a movement error of the stage, the stage position is measured, and a beam irradiation position is adjusted to correct the movement error during imaging.

Figure 6:
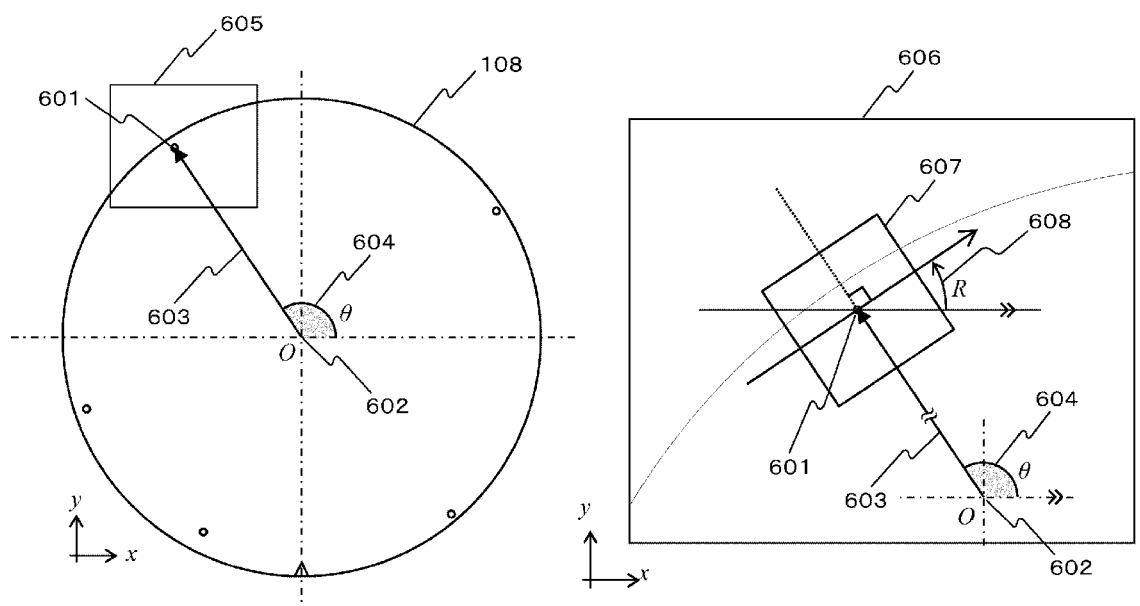
FIG. 6 is a diagram illustrating a relationship between observation position coordinates and an observation position azimuth angle according to the embodiment of the invention.

Next, a scan direction of the electron beam is rotated by controlling the deflector 112 such that edges of the wafer are in parallel in a plurality of images. An example of this method will be described in detail below. For example, an azimuth angle θi of the observation coordinates viewed from the center of the wafer is derived. A straight line 603 connecting observation coordinates 601 with wafer center coordinates 602, and an azimuth angle θ 604 are shown in FIG. 6. 606 is an enlarged view of a region 605. According to this definition, the azimuth angle θi of observation coordinates (dxi, dyi) with the center of the wafer as the origin is obtained via Equation (1).

$$\theta i = a\ \tan(dyi, dxi) \quad (1)$$

A function a tan (y, x) is one that returns an arc tangent of y/x in a range of [−π, π] radians, and the quadrant is appropriately obtained from arguments (y, x). In the present embodiment, the azimuth angle θ is defined as an angle between the straight line 603 and the x axis, but other definitions may be used as long as the rotation in the scan direction can be specified.

After the azimuth angle θi is derived, a scan rotation angle Ri during imaging is determined via the following Equation (2), and is set as an imaging parameter (S507).

$$Ri = \theta i + \alpha \quad (2)$$

α is a parameter that is determined in advance such that the edges of the wafer are substantially in parallel in the plurality of images. For example, if α is set to −π/2 radians (−90 degrees), a background region can be adjusted so as to be positioned on an upper side in the image. During imaging (S508), the imaging field of view is scanned at the set scan rotation angle Ri to obtain an image. A region 607 in FIG. 6 is a field of view where imaging is performed at the observation coordinates 601, and a state in which a scan rotation angle R608 is set is shown therein.

In deriving of the azimuth angle θ and the scan rotation angle R, a database in which the azimuth angle θ or the scan rotation angle R is stored may be referred to for each observation coordinate without performing calculation using Equations 1 and 2.

Figure 7:
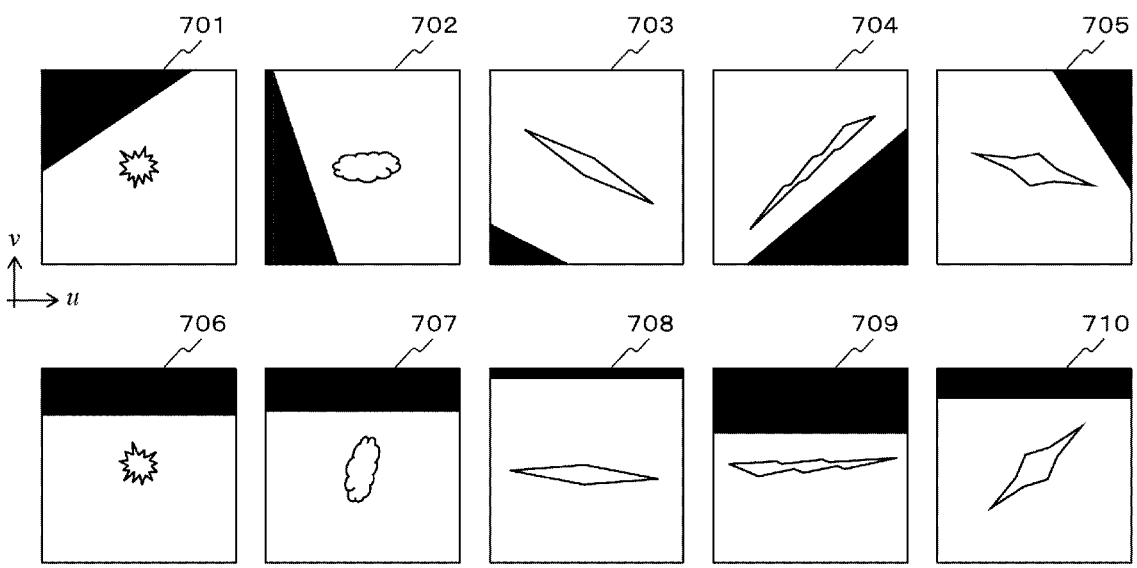
FIG. 7 is a diagram schematically illustrating images before and after scan rotation angle adjustment according to the embodiment of the invention.

A method of detecting a defect portion from the images (S509) after the image capturing (S508) will be described. FIG. 7 schematically shows images captured at five observation coordinates, in which 701 to 705 are images captured without performing scan rotation, and 706 to 710 are images captured after scan rotation is set. In each image, a black region indicates an outside-wafer region (background region), and a white region indicates an in-wafer region. Positional relationships between the in-wafer regions and the background regions are different in images 701 to 705. For example, even if the images 701 and 702 are aligned in (u, v) directions, an appropriate solution does not exist since inclinations of region boundaries are different. Therefore, it is difficult to detect defects through comparative inspection. Meanwhile, the images 706 to 710 are obtained by adjusting the scan rotation angle such that the background region is brought to an upper side of the image. Therefore, when the region boundaries are aligned in the v direction, comparative inspection between images is easy. For example, if an image is captured at a position where the azimuth angle is slightly deviated, a reference image in which no defect exists can be captured. Alternatively, the reference image can be synthesized by integrating pixels in the u direction from one defect image to obtain an average value. For example, the method described in Patent Literature 1 may be used for the comparative inspection.

In this way, after the edges of the wafer are made to be in parallel in the plurality of images through the scan rotation, the plurality of captured images are output. When an image deformation unit moves the images in parallel, the edges of the wafer are substantially at the same position in the images. In this way, the comparative inspection between images is facilitated.

After the defect is detected, an imaging process may be added such that an image is captured again at the detection position with an increased magnification (not shown). Accordingly, a high-resolution image with the defect portion as center can be obtained. The scan rotation angle at this time may be the calculated Ri, or may be a preset fixed value.

In yet another embodiment, in order to make the edges of the wafer substantially at the same position in the plurality of output images, an electron beam scan control unit can adjust the electron beam to adjust the scan direction. In this way, the configuration of the device can be simplified without the need for the image deformation unit.

<Defect Image Classification Processing>

In the present embodiment, a process of classifying captured images (S510) will be described. In classifying of defects occurred in semiconductor manufacturing, it is often effective to classify the defects based on unevenness. For example, when classifying defects of a foreign matter and a scratch, since the foreign matter is convex and the scratch is concave, the foreign matter and the scratch can be easily classified by quantifying the unevenness as a feature amount. A difference in appearance when a convex defect and a concave defect are imaged will be described below with reference to FIG. 8.

801 is a diagram illustrating a cross section of a convex defect. An image 802 is generated using a detector 303, and an image 803 is generated using a detector 304. As described above, the image of each detector can be obtained as an image with a contrast as if light was applied from a position of the detector. Therefore, the image 802 is obtained as if light illuminates from an upper left side where the detector 303 is, that is, the image is obtained in which a left side of a convex portion is illuminated by light to be bright and a right side is shaded and darkened. The same applies to the image 803, and presentation of light and dark is reversed with the image 802. 804 is a diagram illustrating a cross section of a concave defect. An image 805 is generated using the detector 303, and an image 806 is generated using the detector 304. The image 805 is obtained as if light illuminates from an upper left side where the detector 303 is, that is, the image is obtained in which a right side of a concave portion is illuminated by light to be bright and a right side is shaded and darkened. The same applies to the image 806, and presentation of light and dark is reversed with the image 805. The images of the detector 303 and the detector 304 have been described as examples, and the same applies to the detector 301 and the detector 302. Based on the difference in appearance as described above, a method of paying attention to a direction in which a shadow slope exists has been disclosed as a method of determining unevenness from an image (see Patent Literature 5).

Figures 8, 9:
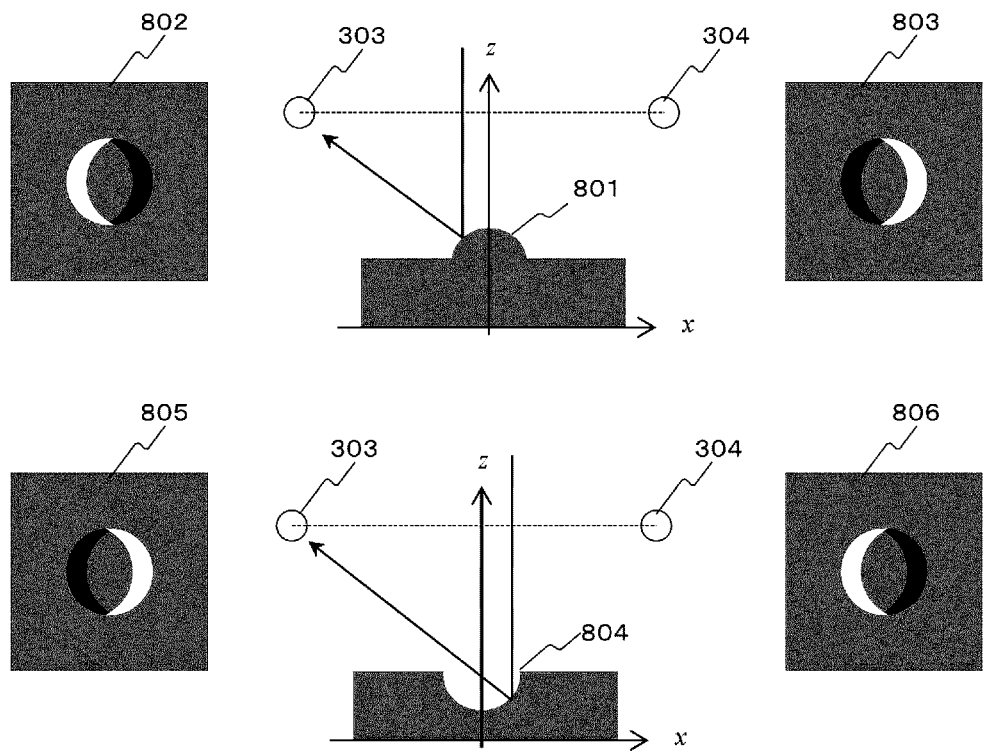
FIG. 8 is a diagram illustrating differences in appearance of uneven defects in each detector according to the embodiment of the invention.
FIG. 9 is a table showing relationships between appearance of uneven defects and scan rotation angles according to the embodiment of the invention.

In captured images, scan rotation angles vary depending on the observation positions according to an embodiment of the invention. A physical positional relationship between the sample and the detector does not change even when the scan rotation angle is changed. Meanwhile, the direction of the detector changes as viewed from the coordinate system ((u, v) coordinate system) of the captured image. As a result, it is difficult to determine the unevenness from the appearance of the image. FIG. 9 is a table showing images of convex defects captured at scan rotation of 0 degree and 180 degrees, and images of concave defects captured at scan rotation of 0 degree and 180 degrees, as well as directions of detectors viewed from the image coordinate system. When capturing the images at the scan rotation of 180 degrees, the presentation of light and dark is reversed since the image is rotated, and the appearances of the convex and the concave are reversed. Therefore, it is difficult to determine the unevenness only from the appearance of the image. However, since the direction of the detector viewed from the image coordinate system is also rotated in accordance with the scan rotation, the unevenness can be determined by considering the direction of the detector. Therefore, the scan rotation angle is stored as supplementary information of the image in accordance with image capturing, and the unevenness can be determined correctly by determining whether the direction of the detector conforms to the direction in which the shadow slope exists. Alternatively, when an image classifier is trained using a machine learning technique such as support vector machine or deep learning, the scan rotation angle, which is a deflection angle of the electron beam, may be used as the feature amount instead of quantifying the unevenness as a feature amount. Accordingly, an identification surface can be formed in consideration of the appearance of the image and the scan rotation angle.

Alternatively, in images that are captured, the scan rotation angles are changed via the image deformation unit depending on the observation positions according to another embodiment of the invention. Therefore, the rotation angle of the image may be used as the feature amount. In this way, it is easy to specify the observation position of the image.

Figure 10:
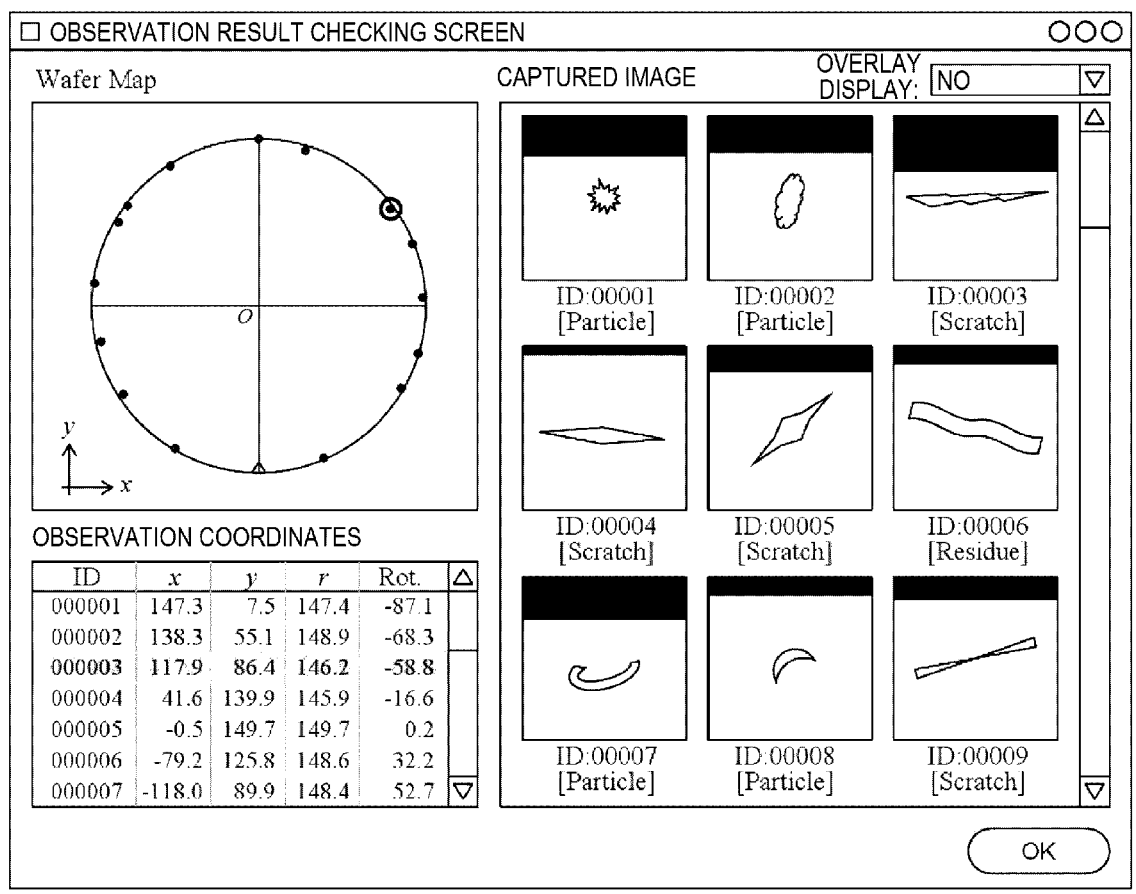
FIG. 10 is a GUI for checking a result of an observation process according to the embodiment of the invention.
Figure 11:
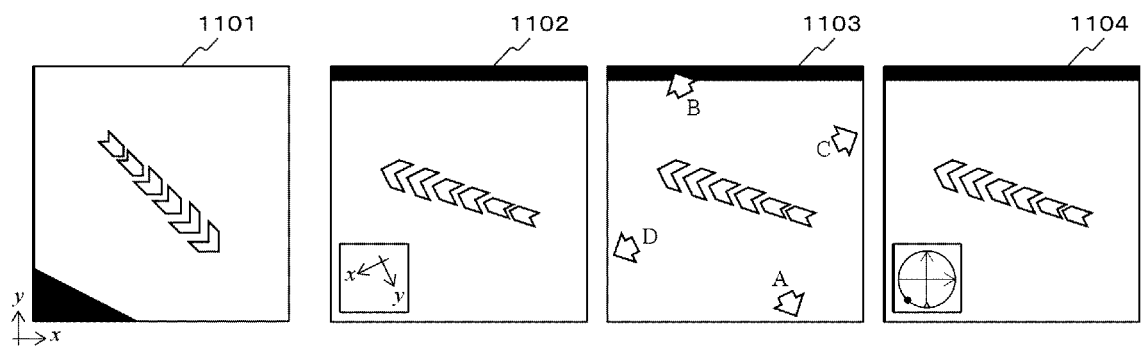
FIG. 11 is a diagram in which supplementary information regarding imaging positions are overlaid and displayed on the image according to an embodiment of the invention.

A GUI for checking an observation process according to an embodiment of the invention is shown in FIG. 10. In the screen, a region for displaying the observation coordinates as a wafer map, a region for displaying a list of observation coordinates in a list form, and a region for displaying a list of images are provided. The observation coordinates can be selected in the region for displaying the wafer map via an interface such as a mouse, and an image of the selected observation coordinates and supplementary information thereof may be displayed in conjunction with an image display unit. When the observation coordinates are displayed in a list, a distance from the center of the wafer, the azimuth angle θ, and the scan rotation angle R may be displayed in addition to coordinate information. When the images are displayed in a list, the supplementary information such as a defect classification result may be displayed. Since the positional relationship between the in-wafer region and the background region is constant in the captured image according to the invention, it is difficult to intuitively grasp which position on the wafer is imaged from the appearance of the image. Therefore, information regarding the imaging position may be overlaid and displayed on the image. FIG. 11 shows an example of information to be overlaid and displayed. 1101 is an image captured when the scan rotation angle is set to 0, and 1102 to 1104 are images captured after the scan rotation angles are adjusted. 1102 shows a result of overlaying and displaying orientation of the wafer coordinate system, 1103 shows a result of overlaying and displaying directions of the detectors 301 to 304, and 1104 shows a result of overlaying and displaying an imaging position on the wafer map. By presenting such information in combination with an image, the user can more intuitively grasp at which position on the wafer the displayed image is captured.

By providing the unit as described above, it is possible to make the positional relationship between the in-wafer region and the background region constant within the imaging field of view even when an observation device including a translation stage is used to image a defect portion on the outer peripheral portion of a wafer. Accordingly, it is unnecessary or easy to separate the in-wafer region and the background region in the defect detection processing, the classification processing, and the like, and the processing speed, the defect detection rate, and the classification accuracy rate are easily improved. Further, by overlaying and displaying the information regarding the imaging position on the image, the user can more intuitively grasp at which position on the wafer the displayed image is captured.

<Defect Observation Method for Semiconductor Wafer II>

In the above embodiment ("defect observation method for semiconductor wafer I"), a method is described in which when an observation device including a translation stage is used to image a defect portion on the outer peripheral portion of a wafer, the scan rotation angle is adjusted, so that the edges of the wafer in a plurality of images are made to be in parallel, and thereafter an image deformation unit moves the images such that the edges of the wafer in the images are substantially at the same position. In the present embodiment, a method will be described in which the scan rotation angle is made constant and the images are deformed, so that the edges of the wafer in the images are substantially at the same position.

The configuration of the device according to the present embodiment is the same as that shown in FIGS. 1 and 2. An interface equivalent to that shown in FIGS. 10 and 11 is provided as the GUI.

Figure 12:
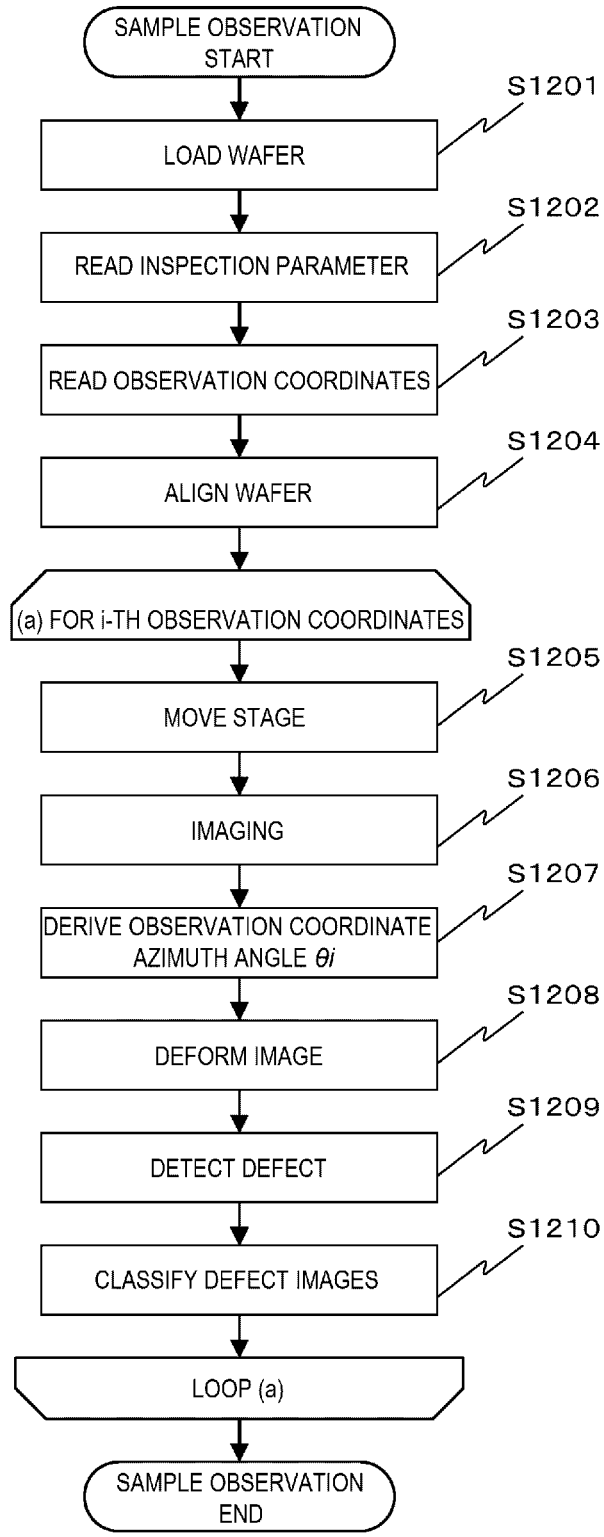
FIG. 12 is a flowchart illustrating a main flow of a sample observation process according to an embodiment of the invention.
Figure 13:
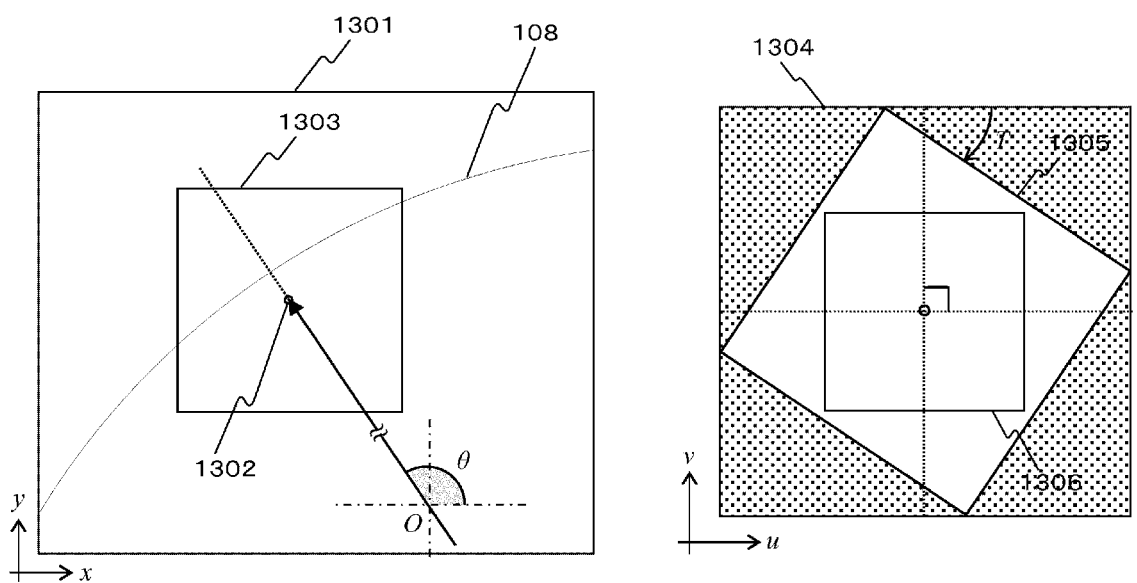
FIG. 13 is a diagram illustrating a method of making a positional relationship between a background region and an in-wafer region constant by image deformation according to an embodiment of the invention.

A flow of an observation process is shown in FIG. 12. The processes from 51201 to 51205 are similar to those from S501 to S505. In the present embodiment, an image is captured using a preset fixed value (for example, 0 degrees) in a process of capturing an image after stage movement (S1206). Next, an azimuth angle θi of observation coordinates viewed from the center of the wafer is calculated using Equation (1). Next, image deformation processing is performed on the image using the image processing unit 210 (S1208). A specific example of the image capturing (S1206), the azimuth angle calculation (S1207) and image deformation (S1208) will be described with reference to FIG. 13. An image in an imaging field of view 1303 is obtained for an observation coordinate 1302. The image deformation unit obtains an image rotation angle Ti from the azimuth angle θi using Equation (3), and rotates the image clockwise. Here, β is a parameter that is determined in advance, and, for example, in a case where the rotation angle during imaging is 0 degree, the background region can be adjusted so as to be positioned on the upper side on the image if the rotation angle is set to −π/2 radians (−90 degrees). An image 1304 is a schematic diagram showing a result of rotating an image 1305 by Ti degrees. A predetermined region image 1306 is cut out from the rotated image 1304, and is output as a deformed image. As can be seen from the drawing, when an image is rotated through image processing, there is a region where the pixel value is indefinite (shaded portion of 1304), and the region to be cut out is limited. In order to solve this problem, the imaging field of view 1303 may be set to be larger than a desired observation region in advance. Specifically, a size of the field of view may be set to about 1.5 times of the desired observation region.

$$Ti = \theta i + \beta \quad (3)$$

Descriptions of a defect detection process (S1209) and a defect classification process (S1210) after the image capturing are similar to the description of the "defect image classification processing".

By providing the image deformation unit as described above, it is possible to make the positional relationship between the in-wafer region and the background region constant in the field of view even when an observation device including a translation stage is used to image a defect portion on the outer peripheral portion of a wafer. Accordingly, it is unnecessary or easy to separate the in-wafer region and the background region in the defect detection processing, the classification processing, and the like, and the processing speed, the defect detection rate, and the classification accuracy rate are easily improved. Further, by displaying the information regarding the imaging position on the image in a superimposed manner, the user can more intuitively grasp at which position on the wafer the displayed image is captured.

<Defect Observation Method for Semiconductor Wafer III>

The method of observing defects located on the outer peripheral portion of the wafer has been described. In the present embodiment, a method of performing a series of operations to observe a defect located on the outer peripheral portion of the wafer and a defect located on an inner side of the outer peripheral portion will be described. Here, the defect located on the inner side of the outer peripheral portion of the wafer is a defect located in a region where a circuit pattern is formed.

The configuration of the device according to the present embodiment is similar to that shown in FIGS. 1 and 2. An interface equivalent to that shown in FIGS. 10 and 11 is provided as the GUI.

Figure 14:
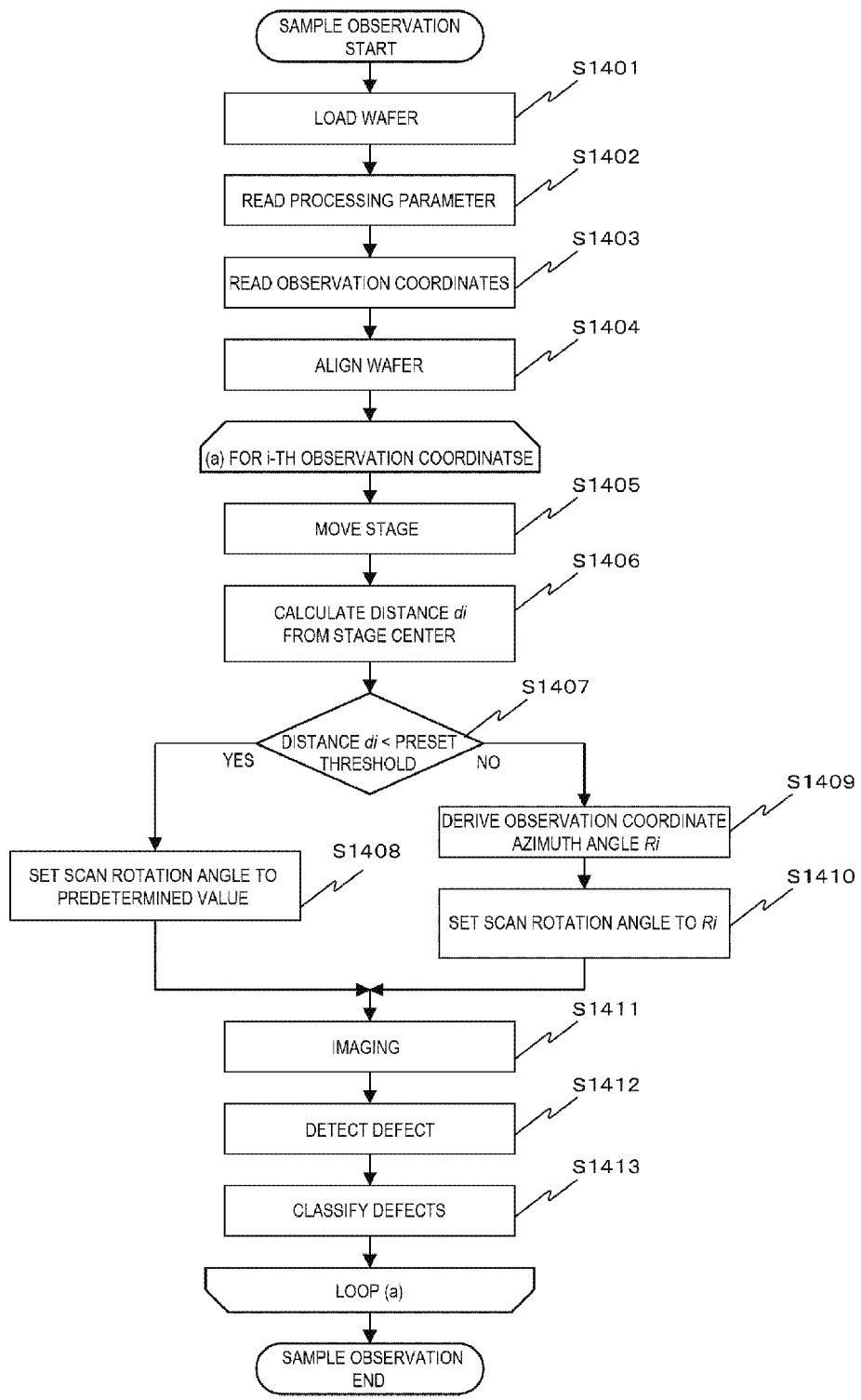
FIG. 14 is a flowchart illustrating a main flow of a sample observation process according to an embodiment of the invention.

FIG. 14 shows a process flow according to the present embodiment. Processes S1401 to S1405 are the same as those S501 to S505. In the present embodiment, a distance di between the observation coordinates and the center of the wafer is calculated (S1406) and is compared with a preset threshold (S1407), and thereby whether the defect is located on the inner side of the outer peripheral portion of the wafer or is located on the outer peripheral portion of the wafer is determined. With respect to defect coordinates output by another inspection device that intensively inspects only the outer peripheral portion, and defect coordinates output by another inspection device that inspects the entire surface of the wafer, a flag is attached to the coordinate information thereof so as to distinguish the two defects, and accordingly the two defects may be determined according to the flag.

With respect to an observation coordinate determined to be located on the inner side of the outer peripheral portion of the wafer, the scan rotation angle is set to a predetermined fixed value (S1408). With respect to the defect located on the inner side, that is, the defect located in the region where the circuit pattern is formed, the direction of the circuit pattern in the images changes along with the scan rotation, which makes it difficult to perform the comparative inspection. As described above, the image is captured such that the positional relationship between the in-wafer region and the background region is constant with respect to the defect coordinate determined to be located on the outer peripheral outer peripheral portion of the wafer. Although the azimuth angle θi is calculated (S1409) and the scan rotation angle is adjusted (S1410) in FIG. 14, the image may be deformed using the image deformation unit. Subsequent processes of image capturing (S1411), defect detection (S1412), and defect classification (S1413) are similar to those from S508 to S510 described above, and conform thereto.

By providing the unit described above, it is possible to observe the defect located on the outer peripheral portion of the wafer and the defect located on the inner side of the outer peripheral portion by using the observation device including the translation stage in a series of operations.

<Program>

One embodiment of the invention is a program that causes a computer to perform the defect observation method. A recording medium that stores the program such that the program is readable by a computer is also one of the embodiments of the invention.

What is claimed is:

1. A defect observation system for a semiconductor wafer, comprising:
   a stage on which the semiconductor wafer is placed and which is movable in an XY direction; and
   a processor configured to control an electron source which irradiates the semiconductor wafer with an electron beam to obtain a plurality of images each having a portion including an edge of the semiconductor wafer, each said image being obtained while moving the semiconductor wafer in an XY direction on a plane,
   wherein the processor is further configured to, with respect to said plurality of obtained images, output a plurality of selected images which are selected from among said plurality of obtained images and in which edges of the semiconductor wafer are substantially in parallel, and to detect a defect of the semiconductor wafer in the output images in which edges of the semiconductor wafer are substantially parallel.

2. The defect observation system according to claim 1, wherein the processor is further configured to, with respect to the plurality selected images, control a deflector to rotate a scan direction of the electron beam emitted by the electron source with respect to the selected images so as to make the edges of the semiconductor wafer substantially in parallel in the plurality of selected images.

3. The defect observation system according to claim 2, wherein the processor is further configured to detect a defect of the semiconductor wafer in the output plurality of selected images, and classify the output plurality of selected images based on a stored rotation angle of the image, said stored rotation angle being stored as supplementary information for each said output image, as a feature amount for image classification associated with each said output image.

4. The defect observation system according to claim 1, wherein the processor is further configured to, with respect to the plurality of selected images, control a deflector to rotate a scan direction of the electron beam emitted by the electron source with respect to the selected images such that the edges of the semiconductor wafer are substantially in parallel, and to move the plurality of selected images in parallel such that the edges of the semiconductor wafer are substantially at a same position, so that the edges of the semiconductor wafer are substantially at the same position in the plurality of images.

5. The defect observation system according to claim 1, wherein the processor is further configured to rotate a scan direction of the electron beam by controlling a deflector so as to make the edges of the semiconductor wafer substantially in parallel in the plurality of selected images, and wherein the defect observation system is a charged particle microscope.

6. The defect observation system according to claim 5, wherein the processor is further configured to adjust a scan direction of the electron beam so as to make the edges of the semiconductor wafer substantially in parallel in the plurality of selected images, wherein the processor is further configured to, with respect to the plurality of selected images in which the edges of the semiconductor wafer are substantially parallel, move the images in parallel so as to make the edges of the semiconductor wafer substantially at a same position in the plurality of selected images, and wherein defect observation system is a charged particle microscope.

7. The defect observation system according to claim 5, wherein the processor is further configured to adjust a scan direction by controlling a deflection angle of the electron beam so as to make the edges of the semiconductor wafer substantially at a same position in the plurality of selected images, and wherein the defect observation system is a charged particle microscope.

8. The defect observation system according to claim 5, wherein the processor is further configured to detect a defect of the semiconductor wafer in the output plurality of selected images, and classify the output plurality of selected images based on a stored deflection angle of the electron beam which is stored as supplementary information for each said output image, as a feature amount for image classification associated with each said output image.

9. The defect observation system according to claim 1, wherein the processor is further configured to output the plurality of selected images in which the edges of the semiconductor wafer are substantially in parallel or substantially at a same position in the plurality of obtained images.

10. The defect observation system according to claim 1, wherein the processor is further configured to detect a defect of the semiconductor wafer in the output plurality of selected images and classify the output plurality of selected images based on stored position information associated with each said selected image, said stored position information indicating a positional relationship between a background region and an in-wafer region for each of the output images.

11. A defect observation method for a semiconductor wafer, comprising:

an imaging step of imaging a plurality of portions including an edge of the semiconductor wafer while moving the semiconductor wafer in an XY direction on a plane;

an output step of, with respect to a plurality of images obtained by imaging, outputting images in which edges of the semiconductor wafer are substantially in parallel among the plurality of images; and a defect detection step of detecting a defect of the semiconductor wafer in the output images.

12. The defect observation method according to claim 11, wherein in the image output step, the images in which the edges of the semiconductor wafer are substantially at the same position in the plurality of images are output.

13. The defect observation method according to claim 11, further comprising:

a classification step of classifying the output images by adjusting a scan rotation angle of the output images so that the edges of the semiconductor device are aligned in one direction for each of the output images and a positional relationship between a background region and an in-wafer region is the same for each of the output images.

14. A non-transitory computer-readable medium upon which is embodied a sequence of programmed instructions which, when executed by a processor, cause the processor to perform the following:

an imaging step of imaging a plurality of portions including an edge of the semiconductor wafer while moving the semiconductor wafer in an XY direction on a plane;

an output step of, with respect to a plurality of images obtained by imaging, outputting images in which edges of the semiconductor wafer are substantially in parallel among the plurality of images; and a defect detection step of detecting a defect of the semiconductor wafer in the output images.

15. The non-transitory computer-readable medium according to claim 14, wherein in the image output step, the images in which the edges of the semiconductor wafer are substantially at the same position in the plurality of images are output.

16. The non-transitory computer-readable medium according to claim 14, wherein the instructions further comprise:

a classification step of classifying the output images by adjusting a scan rotation angle of the output images so that the edges of the semiconductor device are aligned in one direction for each of the output images and a positional relationship between a background region and an in-wafer region is the same for each of the output images.

* * * * *